US009566686B2

(12) United States Patent
Grumbine et al.

(10) Patent No.: US 9,566,686 B2
(45) Date of Patent: Feb. 14, 2017

(54) COMPOSITION FOR TUNGSTEN CMP

(71) Applicant: Cabot Microelectronics Corporation, Aurora, IL (US)

(72) Inventors: Steven Grumbine, Aurora, IL (US); Jeffrey Dysard, St. Charles, IL (US); Lin Fu, Naperville, IL (US); William Ward, Glen Ellyn, IL (US); Glenn Whitener, Batavia, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 14/965,168

(22) Filed: Dec. 10, 2015

(65) Prior Publication Data
US 2016/0089763 A1 Mar. 31, 2016

Related U.S. Application Data

(62) Division of application No. 14/203,621, filed on Mar. 11, 2014, now Pat. No. 9,238,754.

(51) Int. Cl.
| | |
|---|---|
| *B24B 37/04* | (2012.01) |
| *C23F 1/40* | (2006.01) |
| *H01L 21/321* | (2006.01) |
| *C09G 1/02* | (2006.01) |

(52) U.S. Cl.
CPC ............... *B24B 37/044* (2013.01); *C09G 1/02* (2013.01); *C23F 1/40* (2013.01); *H01L 21/3212* (2013.01)

(58) Field of Classification Search
None
See application file for complete search history.

(56) References Cited

U.S. PATENT DOCUMENTS

| | | | | |
|---|---|---|---|---|
| 5,958,288 A | * | 9/1999 | Mueller | C09G 1/02 216/53 |
| 6,776,810 B1 | * | 8/2004 | Cherian | B24B 37/044 106/3 |
| 9,303,188 B2 | * | 4/2016 | Grumbine | H01L 21/3212 |
| 9,303,189 B2 | * | 4/2016 | Grumbine | H01L 21/3212 |
| 2004/0132305 A1 | * | 7/2004 | Nishimoto | C09G 1/02 438/690 |
| 2004/0152309 A1 | * | 8/2004 | Carter | C03C 19/00 438/689 |
| 2005/0076581 A1 | * | 4/2005 | Small | B24B 37/044 51/307 |
| 2006/0117667 A1 | * | 6/2006 | Siddiqui | C03C 19/00 51/309 |
| 2006/0186089 A1 | * | 8/2006 | Shida | H01L 21/3212 216/88 |
| 2007/0157524 A1 | * | 7/2007 | Lortz | C09G 1/02 51/298 |
| 2008/0060277 A1 | * | 3/2008 | White | C09G 1/02 51/298 |
| 2009/0133716 A1 | * | 5/2009 | Lee | C09G 1/02 134/3 |
| 2010/0181525 A1 | * | 7/2010 | Belmont | B82Y 30/00 252/79.1 |
| 2013/0280910 A1 | * | 10/2013 | Ihnfeldt | C09K 3/1454 438/693 |
| 2014/0273458 A1 | * | 9/2014 | Shi | C09G 1/02 438/692 |
| 2015/0218709 A1 | * | 8/2015 | Yoshizaki | C09K 3/1436 252/79.2 |

* cited by examiner

*Primary Examiner* — Allan Olsen
(74) *Attorney, Agent, or Firm* — Thomas Omholt; Erika Wilson; Christopher C. Streinz

(57) ABSTRACT

A chemical mechanical polishing composition for polishing a substrate having a tungsten layer includes a water based liquid carrier, a colloidal silica abrasive dispersed in the liquid carrier and having a permanent positive charge of at least 6 mV, an amine compound in solution in the liquid carrier, and an iron containing accelerator. A method for chemical mechanical polishing a substrate including a tungsten layer includes contacting the substrate with the above described polishing composition, moving the polishing composition relative to the substrate, and abrading the substrate to remove a portion of the tungsten from the substrate and thereby polish the substrate.

8 Claims, No Drawings

COMPOSITION FOR TUNGSTEN CMP

BACKGROUND OF THE INVENTION

Chemical mechanical polishing (CMP) compositions and methods for polishing (or planarizing) the surface of a substrate are well known in the art. Polishing compositions (also known as polishing slurries, CMP slurries, and CMP compositions) for polishing metal layers (such as tungsten) on a semiconductor substrate may include abrasive particles suspended in an aqueous solution and chemical accelerators such as oxidizers, chelating agents, catalysts, and the like.

In a conventional CMP operation, the substrate (wafer) to be polished is mounted on a carrier (polishing head) which is in turn mounted on a carrier assembly and positioned in contact with a polishing pad in a CMP apparatus (polishing tool). The carrier assembly provides a controllable pressure to the substrate, pressing the substrate against the polishing pad. The substrate and pad are moved relative to one another by an external driving force. The relative motion of the substrate and pad abrades and removes a portion of the material from the surface of the substrate, thereby polishing the substrate. The polishing of the substrate by the relative movement of the pad and the substrate may be further aided by the chemical activity of the polishing composition (e.g., by an oxidizing agent and other chemical compounds present in the CMP composition) and/or the mechanical activity of an abrasive suspended in the polishing composition.

In typical tungsten plug and interconnect processes, tungsten is deposited over a dielectric and within openings formed therein. The excess tungsten over the dielectric layer is then removed during a CMP operation to form tungsten plugs and interconnects within the dielectric. As semiconductor device feature sizes continue to shrink, meeting local and global planarity requirements has become more difficult in CMP operations (e.g., in tungsten CMP operations). Array erosion (also referred to as oxide erosion), plug and line recessing, and tungsten etching defects are known to compromise planarity and overall device integrity. For example, excessive array erosion may lead to difficulties in subsequent lithography steps as well as cause electrical contact problems that can degrade electrical performance. Tungsten etching/corrosion and plug and line recessing may also degrade electrical performance or even cause device failure.

Commercially available tungsten CMP slurries commonly make use of a hydrogen peroxide oxidizer. While there are many advantages to the use of hydrogen peroxide, it is known to cause excessive tungsten etching in certain CMP operations. In such operations it may be advantageous to reduce the rate at which tungsten etches (corrodes) in the CMP composition. Thus, there is a need in the industry for tungsten CMP slurries (or compositions) that are less corrosive towards tungsten (i.e., in which tungsten etches at a lower rate).

BRIEF SUMMARY OF THE INVENTION

A chemical mechanical polishing composition for polishing a substrate having a tungsten layer is disclosed. The polishing composition includes a water based liquid carrier, a colloidal silica abrasive dispersed in the liquid carrier and having a permanent positive charge of at least 6 mV, an amine compound in solution in the liquid carrier, and an iron containing accelerator. In one embodiment, the amine compound includes an alkyl group having at least 12 carbon atoms. A method for chemical mechanical polishing a substrate including a tungsten layer is further disclosed. The method may include contacting the substrate with the above described polishing composition, moving the polishing composition relative to the substrate, and abrading the substrate to remove a portion of the tungsten from the substrate and thereby polish the substrate.

DETAILED DESCRIPTION OF THE INVENTION

A chemical mechanical polishing composition for polishing a substrate having a tungsten layer is disclosed. The polishing composition includes a water based liquid carrier, a colloidal silica abrasive dispersed in the liquid carrier and having a permanent positive charge of at least 6 mV, and an amine compound in solution in the liquid carrier. The amine compound may include substantially any suitable amine compound, for example, an amine compound including an alkyl group having 12 or more carbon atoms, a polycationic amine compound, and/or an amine containing polymer. The polishing composition may further optionally include an iron containing accelerator, such as an iron containing catalyst, a stabilizer bound to the iron containing accelerator, a hydrogen peroxide oxidizer, and/or a pH in a range from about 2.0 to about 3.5. The colloidal silica may also be treated with an aminosilane compound.

The polishing composition contains an abrasive including colloidal silica particles which are desirably suspended in a liquid carrier (e.g., water). As used herein the term colloidal silica particles refers to silica particles that are prepared via a wet process rather than a pyrogenic or flame hydrolysis process which produces structurally different particles. The colloidal silica particles may be aggregated or non-aggregated. Non-aggregated particles are individually discrete particles that may be spherical or nearly spherical in shape, but can have other shapes as well (such as generally elliptical, square, or rectangular cross-sections). Aggregated particles are particles in which multiple discrete particles are clustered or bonded together to form aggregates having generally irregular shapes.

Preferably, the colloidal silica is precipitated or condensation-polymerized silica, which may be prepared using any method known to those of ordinary skill in the art, such as by the sol gel method or by silicate ion-exchange. Condensation-polymerized silica particles are often prepared by condensing $Si(OH)_4$ to form substantially spherical particles. The precursor $Si(OH)_4$ may be obtained, for example, by hydrolysis of high purity alkoxysilanes, or by acidification of aqueous silicate solutions. Such abrasive particles may be prepared, for example, in accordance with U.S. Pat. No. 5,230,833 or may be obtained as any of various commercially available products such as the BINDZIL 50/80, 30/310, and 40/130 products from EKA Chemicals, the Fuso PL-1, PL-2, PL-3, and PL-3H products, and the Nalco 1034A, 1050, 2327, and 2329 products, as well as other similar products available from DuPont, Bayer, Applied Research, Nissan Chemical (the SNOWTEX products), and Clariant.

The particle size of a particle is the diameter of the smallest sphere that encompasses the particle. The abrasive particles may have any suitable particle size. The abrasive particles may have an average particle size of about 5 nm or more (e.g., about 10 nm or more, about 15 nm or more, about 20 nm or more, or about 30 nm or more). The abrasive particles may have an average particle size of about 150 nm or less (e.g., about 130 nm or less, about 80 nm or less, about 50 nm or less, or about 30 nm or less). Accordingly, the abrasive particles may have an average particle size in a range from about 10 nm to about 150 nm (e.g., from about 20 nm to about 130 nm, from about 15 nm to about 100 nm, from about 20 nm to about 80 nm, or from about 20 nm to about 60 nm).

The polishing composition may include any suitable amount of colloidal silica particles. The polishing composition typically includes about 0.01 wt. % or more colloidal silica (e.g., about 0.05 wt. % or more). More typically, the polishing composition may include about 0.1 wt. % or more (e.g., about 1 wt. % or more, about 5 wt. % or more, about 7 wt. % or more, about 10 wt. % or more, or about 12 wt. % or more) colloidal silica particles. The amount of colloidal silica particles in the polishing composition is typically about 30 wt. % or less, and more typically about 20 wt. % or less (e.g., about 15 wt. % or less, about 10 wt. % or less, about 5 wt. % or less, about 3 wt. % or less, or about 2 wt. % or less). Preferably, the amount of colloidal silica particles in the polishing composition is in a range from about 0.01 wt. % to about 20 wt. %, and more preferably from about 0.05 wt. % to about 15 wt. % (e.g., from about 0.1 wt. % to about 10 wt. %, from about 0.1 wt. % to about 4 wt. %, from about 0.1 wt. % to about 3 wt. %, from about 0.1 wt. % to about 2 wt. %, or from about 0.2 wt. % to about 2 wt. %).

The liquid carrier is used to facilitate the application of the abrasive and any optional chemical additives to the surface of a suitable substrate to be polished (e.g., planarized). The liquid carrier may be any suitable carrier (e.g., a solvent) including lower alcohols (e.g., methanol, ethanol, etc.), ethers (e.g., dioxane, tetrahydrofuran, etc.), water, and mixtures thereof. Preferably, the liquid carrier comprises, consists essentially of, or consists of water, more preferably deionized water.

The colloidal silica particles have a positive charge of at least 6 mV in the polishing composition. The charge on dispersed particles such as colloidal silica particles is commonly referred to in the art as the zeta potential (or the electrokinetic potential). The zeta potential of a particle refers to the electrical potential difference between the electrical charge of the ions surrounding the particle and the electrical charge of the bulk solution of the polishing composition (e.g., the liquid carrier and any other components dissolved therein). The zeta potential is typically dependent on the pH of the aqueous medium. For a given polishing composition, the isoelectric point of the particles is defined as the pH at which the zeta potential is zero. As the pH is increased or decreased away from the isoelectric point, the surface charge (and hence the zeta potential) is correspondingly decreased or increased (to negative or positive zeta potential values). The zeta potential of a dispersion such as a polishing composition may be obtained using commercially available instrumentation such as the Zetasizer available from Malvern Instruments, the ZetaPlus Zeta Potential Analyzer available from Brookhaven Instruments, and an electro-acoustic spectrometer available from Dispersion Technologies, Inc.

The colloidal silica particles in the polishing composition have a permanent positive charge of about 6 mV or more (e.g., about 10 mV or more, about 15 mV or more, about 20 mV or more, about 25 mV or more, or about 30 mV or more). The colloidal silica particles in the polishing composition may have a permanent positive charge of about 50 mV or less (e.g., about 45 mV or less, about 40 mV or less, or about 35 mV or less). Preferably, the colloidal silica particles have a permanent positive charge in a range from about 6 mV to about 50 mV (e.g., about 10 mV to about 45 mV, about 15 mV to about 40 mV, or about 20 mV to about 40 mV).

By permanent positive charge it is meant that the positive charge on the silica particles is not readily reversible, for example, via flushing, dilution, filtration, and the like. A permanent positive charge may be the result, for example, of covalently bonding a cationic compound with the colloidal silica. A permanent positive charge is in contrast to a reversible positive charge that may be the result, for example, of an electrostatic interaction between a cationic compound and the colloidal silica.

Notwithstanding, as used herein, a permanent positive charge of at least 6 mV means that the zeta potential of the colloidal silica particles remains above 6 mV after the following three step ultrafiltration test. A volume of the polishing composition (e.g., 200 ml) is passed through a Millipore Ultracell regenerated cellulose ultrafiltration disk (e.g., having a MW cutoff of 100,000 Daltons and a pore size of 6.3 nm). The remaining dispersion (the dispersion that is retained by the ultrafiltration disk) is collected and replenished to the original volume with pH adjusted deionized water. The deionized water is pH adjusted to the original pH of the polishing composition using a suitable inorganic acid such as nitric acid. This procedure is repeated for a total of three ultrafiltration cycles (each of which includes an ultrafiltration step and a replenishing step). The zeta-potential of the triply ultra-filtered and replenished polishing composition is then measured and compared with the zeta potential of the original polishing composition. This three step ultrafiltration test is further illustrated below by way of example (in Example 5).

While not wishing to be bound by theory, it is believed that the dispersion retained by the ultrafiltration disk (the retained dispersion) includes the colloidal silica particles and any chemical compounds (e.g., cationic compounds) that may be associated with the surface of the particles (e.g., bonded or attached to or electrostatically interacting with the particle surface). At least a portion of the liquid carrier and the chemical compounds dissolved therein pass through the ultrafiltration disk. Replenishing the retained dispersion to the original volume is believed to upset the equilibrium in the original polishing composition such that the chemical compounds associated with the particle surface may tend towards a new equilibrium. Compounds that are strongly associated (e.g., covalently bonded) with the particle surface remain on the surface such that there tends to be little if any change in the positive zeta potential of the particle. In contrast, a portion of compounds that have a weaker association (e.g., an electrostatic interaction) with the particle surface may return to the solution as the system tends towards the new equilibrium thereby resulting in a reduction in the positive zeta potential. Repeating this process for a total of three ultrafiltration and replenishing cycles is believed to amplify the above described effect.

It is preferred that after correcting for ionic strength differences there is little (or no) difference between the zeta potential of the colloidal silica particles in the original polishing composition and the particles in the triply ultra-filtered and replenished polishing composition obtained from the above described three step ultrafiltration test. It will be understood that prior to correcting for ionic strength differences, the measured zeta potential may be observed to increase due to the reduced ionic strength (owing to dilution) of the triply ultra-filtered and replenished polishing composition. After correcting for ionic strength differences, it is preferred that any reduction in the positive charge (reduction in the positive zeta potential) on the particles resulting from the aforementioned three step ultrafiltration test is less than 10 mV (e.g., less than about 7 mV, less than about 5 mV, or even less than about 2 mV).

The polishing composition is generally acidic having a pH of less than about 7. The polishing composition typically has a pH of about 1 or more (e.g., about 1.5 or more, or about 2 or more). Preferably, the polishing composition has a pH of about 6 or less (e.g., about 5 or less, or about 4 or less). More preferably, the polishing composition has a pH in a range from about 1 to about 6 (e.g., from about 1.5 to about 5, or from about 2 to about 4, or from about 2 to about 3.5). The pH of the polishing composition may be achieved and/or maintained by any suitable means. The polishing composition may include substantially any suitable pH adjusting agents or buffering systems. For example, suitable pH adjusting agents may include nitric acid, sulfuric acid, phosphoric acid, phthalic acid, citric acid, adipic acid, oxalic acid, malonic acid, maleic acid, ammonium hydroxide, and the like while suitable buffering agents may include phosphates, sulfates, acetates, malonates, oxalates, borates, ammonium salts, and the like.

Colloidal silica particles having a permanent positive charge in the polishing composition may be achieved, for example, via treating the particles with at least one aminosilane compound. Such compounds include primary aminosilanes, secondary aminosilanes, tertiary aminosilanes, quaternary aminosilanes, and multi-podal (e.g., dipodal) aminosilanes. The aminosilane compound can be any suitable aminosilane, such as bis(2-hydroxyethyl)-3-aminopropyl trialkoxysilane, diethylaminomethyltrialkoxysilane, (N,N-diethyl-3-aminopropyl)trialkoxysilane), 3-(N-styrylmethyl-2-aminoethylaminopropyl trialkoxysilane, aminopropyl trialkoxysilane, (2-N-benzylaminoethyl)-3-aminopropyl trialkoxysilane), trialkoxysilyl propyl-N,N,N-trimethyl ammonium chloride, N-(trialkoxysilylethyl) benzyl-N,N,N-trimethyl ammonium chloride, (bis (methyldialkoxysilylpropyl)-N-methyl amine, bis (trialkoxysilylpropyl)urea, bis(3-(trialkoxysilyl)propyl)-ethylenediamine, bis(trialkoxysilylpropyl)amine, bis (trialkoxysilylpropyl)amine, and mixtures thereof.

Any suitable method of treating the colloidal silica particles, many of which are known to those of ordinary skill in the art may be used. For example, the colloidal silica particles may be treated with the aminosilane compound before mixing with the other components of the polishing composition or the aminosilane and the colloidal silica particles may be added simultaneously to the other components of the polishing composition.

The aminosilane compound may be present in the polishing composition in any suitable amount. The amount of aminosilane utilized may depend on several factors, for example, including the particle size, the surface area of the particle, the particular aminosilane compound used, and the desired charge on the particle. In general the amount of aminosilane used increases with decreasing particle size (and therefore increasing surface area) and increasing charge on the particle. For example, to achieve a permanent positive charge of 25 mV or more, 20 ppm or more of aminosilane may be used for a dispersion having a particle size of 110 nm, 70 ppm or more of aminosilane may be used for a dispersion having a particle size of 75 nm, and 130 ppm or more of aminosilane may be used for a dispersion having a particle size of 55 nm. Thus the polishing composition may include about 5 ppm or more (e.g., about 10 ppm or more, about 15 ppm or more, or about 20 ppm or more) of the aminosilane compound. The polishing composition preferably includes an amount of aminosilane sufficient to provide the desired permanent positive charge without using an excess. Thus the polishing composition may include about 500 ppm or less (e.g., about 300 ppm or less, or about 200 ppm or less, or about 150 ppm or less) of the aminosilane compound. Preferably, the polishing composition includes a range from about 5 ppm to about 500 ppm (e.g., from about 10 ppm to about 300 ppm, from about 15 ppm to about 200 ppm, or from about 20 ppm to about 150 ppm) of the aminosilane compound.

Optional embodiments of the polishing composition may further include an iron containing accelerator. An iron containing accelerator as used herein is an iron containing chemical compound that increases the removal rate of tungsten during a tungsten CMP operation. For example, the iron containing accelerator may include an iron containing catalyst such as is disclosed in U.S. Pat. Nos. 5,958,288 and 5,980,775. Such an iron containing catalyst may be soluble in the liquid carrier and may include, for example, ferric (iron III) or ferrous (iron II) compounds such as iron nitrate, iron sulfate, iron halides, including fluorides, chlorides, bromides, and iodides, as well as perchlorates, perbromates and periodates, and organic iron compounds such as iron acetates, acetylacetonates, citrates, gluconates, malonates, oxalates, phthalates, and succinates, and mixtures thereof.

An iron containing accelerator may also include an iron containing activator (e.g., a free radical producing compound) or an iron containing catalyst associated with (e.g., coated or bonded to) the surface of the colloidal silica particle such as is disclosed in U.S. Pat. Nos. 7,029,508 and 7,077,880. For example, the iron containing accelerator may be bonded with the silanol groups on the surface of the colloidal surface particle. In one embodiment the iron containing accelerator may include a boron containing stabilizer and an iron containing catalyst. In such embodiments the stabilizer and catalyst may occupy substantially any percentage of the available surface sites on the colloidal silica particles, for example, greater than 1%, greater than 50%, or greater than 80% of the available surface sites.

The amount of iron containing accelerator in the polishing composition may be varied depending upon the oxidizing agent used and the chemical form of the accelerator. When the preferred oxidizing agent hydrogen peroxide (or its analogs) is used and a soluble iron containing catalyst is used (such as ferric nitrate), the catalyst may be present in the composition in an amount sufficient to provide a range from about 1 to about 3000 ppm Fe based on the total weight of the composition. The polishing composition preferably includes about 1 ppm Fe or more (e.g., about 5 ppm or more, about 10 ppm or more, or about 20 ppm or more). The polishing composition preferably includes about 500 ppm Fe or less (e.g., about 200 ppm or less, about 100 ppm or less, or about 50 ppm or less). The polishing composition may thus include a range from about 1 to about 500 ppm Fe (e.g., from about 3 to about 200 ppm, from about 5 to about 100 ppm, or from about 10 to about 50 ppm).

Embodiments of the polishing composition including an iron containing accelerator may further include a stabilizer. Without such a stabilizer, the iron containing accelerator and the oxidizing agent may react in a manner that degrades the oxidizing agent rapidly over time. The addition of a stabilizer tends to reduce the effectiveness of the iron containing accelerator such that the choice of the type and amount of stabilizer added to the polishing composition may have a significant impact on CMP performance. The addition of a stabilizer may lead to the formation of a stabilizer/accelerator complex that inhibits the accelerator from reacting with the oxidizing agent while at the same time allowing the accelerator to remain sufficiently active so as to promote rapid tungsten polishing rates.

Useful stabilizers include phosphoric acid, organic acids, phosphonate compounds, nitriles, and other ligands which bind to the metal and reduce its reactivity toward hydrogen peroxide decomposition and mixture thereof. The acid stabilizers may be used in their conjugate form, e.g., the carboxylate can be used instead of the carboxylic acid. For purposes of this application the term "acid" as it is used to describe useful stabilizers also means the conjugate base of the acid stabilizer. For example the term "adipic acid" means adipic acid and its conjugate base. Stabilizers can be used alone or in combination and significantly decrease the rate at which oxidizing agents such as hydrogen peroxide decomposes.

Preferred stabilizers include phosphoric acid, phthalic acid, citric acid, adipic acid, oxalic acid, malonic acid, aspartic acid, succinic acid, glutaric acid, pimelic acid, suberic acid, azelaic acid, sebacic acid, maleic acid, glutaconic acid, muconic acid, ethylenediaminetetraacetic acid (EDTA), propylenediaminetetraacetic acid (PDTA), and mixtures thereof. The preferred stabilizers may be added to the compositions and slurries of this invention in an amount ranging from about 1 equivalent per iron containing accelerator to about 3.0 weight percent or more. As used herein, the term "equivalent per iron containing accelerator" means one molecule of stabilizer per iron ion in the composition. For example 2 equivalents per iron containing accelerator means two molecules of stabilizer for each catalyst ion.

The polishing composition may further include an oxidizing agent. The oxidizing agent may be added to the polishing composition during the slurry manufacturing process or just prior to the CMP operation (e.g., in a tank located at the semiconductor fabrication facility). Preferable oxidizing agents include inorganic or organic per-compounds. A per-compound as defined by Hawley's Condensed Chemical Dictionary is a compound containing at least one peroxy group (—O—O—) or a compound containing an element in its highest oxidation state. Examples of compounds containing at least one peroxy group include but are not limited to hydrogen peroxide and its adducts such as urea hydrogen peroxide and percarbonates, organic peroxides such as benzoyl peroxide, peracetic acid, and di-t-butyl peroxide, monopersulfates ($SO_5^=$), dipersulfates ($S_2O_8^=$), and sodium peroxide. Examples of compounds containing an element in its highest oxidation state include but are not limited to periodic acid, periodate salts, perbromic acid, perbromate salts, perchloric acid, perchlorate salts, perboric acid, and perborate salts and permanganates. The most preferred oxidizing agents is hydrogen peroxide.

The oxidizing agent may be present in the polishing composition in an amount ranging, for example, from about 0.1 to about 10 weight percent. In preferred embodiments in which a hydrogen peroxide oxidizer and a soluble iron containing accelerator are used, the oxidizer may be present in the polishing composition in an amount ranging from about 0.1 to about 6 weight percent (e.g., from about 0.2 to about 5 weight percent, from about 0.5 to about 4 weight percent, or from about 1 to about 3 weight percent).

The polishing composition further includes an amine compound in solution in the liquid carrier. The amine compound may include substantially any amine compound that inhibits tungsten etching (i.e., reduces tungsten etch rates) in the presence of an oxidizer such as hydrogen peroxide. The addition of an amine compound may also have a negative impact on CMP performance. Thus the amine compound may be selected such that it advantageously inhibits tungsten etching while at the same time allowing for high tungsten removal rates during the CMP operation. The amine compound (or compounds) may include a primary amine, a secondary amine, a tertiary amine, or a quaternary amine. The amine compound may further include a monoamine, a diamine, a triamine, a tetramine, or an amine based polymer having a large number of repeating amine groups (e.g., 4 or more amine groups).

In certain embodiments of the polishing compound the amine compound may include a long chain alkyl group. By long chain alkyl group it is meant that the amine compound includes an alkyl group having at least 10 carbon atoms (e.g., at least 12 carbon atoms or at least 14 carbon atoms). Such amine compounds may include, for example, dodecylamine, tetradecylamine, hexadecylamine, octadecylamine, oleylamine, N-methyldioctylamine, N-methyloctadecylamine, cocamidopropylamine oxide, benzyldimethylhexadecylammonium chloride, benzalkonium chloride, cocoalkylmethyl[polyoxyethylene (15)]ammonium chloride, octadecylmethyl[polyoxyethylene (15)]ammonium chloride, cetyltrimethylammonium bromide, and the like.

In certain embodiments of the polishing composition the amine compound may include a polycationic amine. A polycationic amine (as the term is used herein) is an amine compound having multiple (two or more) amine groups in which each of the amine groups is cationic (i.e., has a positive charge). Thus the polycationic amine may include a polyquaternary amine. By polyquaternary amine it is meant that the amine compound includes from 2 to 4 quaternary ammonium groups such that the polyquaternary amine is a diquaternary amine, a triquaternary amine, or a tetraquaternary amine compound. Diquaternary amine compounds may include, for example, N,N'-methylenebis(dimethyltetradecylammonium bromide), 1,1,4,4-tetrabutylpiperazinediium dibromide, N,N,N',N',N'-pentamethyl-N-tallow-1,3-propane-diammonium dichloride, N,N'-hexamethylenebis(tributylammonium hydroxide), decamethonium bromide, didodecyl-tetramethyl-1,4-butanediaminium diiodide, 1,5-dimethyl-1,5-diazoniabicyclo(3.2.2)nonane dibromide, and the like. Triquaternary amine compounds may include, for example, N(1),N(6)-didoecyl-N(1),N(1),N(6),N(6)-tetramethyl-1,6-hexanediaminium diiodide. Tetraquaternary amine compounds may include, for example, methanetetrayltetrakis(tetramethylammonium bromide). The polyquaternary amine compound may further include a long chain alkyl group (e.g., having 10 or more carbon atoms). For example, a polyqyaternary amine compound having a long chain alkyl group may include N,N'-methylenebis (dimethyltetradecylammonium bromide), N,N,N',N',N'-pentamethyl-N-tallow-1,3-propane-diammonium dichloride, didodecyl-tetramethyl-1,4-butanediaminium diiodide, and N(1),N(6)-didodecyl-N(1),N(1),N(6),N(6)-tetramethyl-1,6-hexanediaminium diiodide.

A polycationic amine may also be polycationic in that each of the amine groups is protonated (and therefore has a positive charge). For example, a dicationic amine such as tetramethyl-p-phenylenediamine includes two tertiary amine groups that may be protonated (and therefore positively charged) at polishing composition pH values less than the pKa of the amine compound.

In certain embodiments of the polishing composition the amine compound may include an amine based polymer. Such a polymer includes four or more amine groups. The amine based polymer may include, for example, triethylenetetramine, tetraethylenepentamine, pentaethylenehexamine, and polymers including the following amine containing functional groups methacryloylox-ethyl trimethyl ammonium methylsulfate, diallyl dimethyl ammonium chloride, and methacrylamido-propyl trimethyl ammonium chloride.

It will be understood that the amine compound does not include a heterocyclic polyamine. Heterocyclic polyamines are amine compounds having multiple amine groups in which at least one of the amine groups is located in a ring (e.g., a ring including 3, 4, 5, 6, 7, or 8 members). Such heterocyclic amine compounds include, for example, certain pyridine, pyridylamine, pyrimidine, and azole compounds. While such heterocyclic polyamines (such as benzotriazole) are known inhibitors of copper etching, their utility in inhibiting tungsten etching tends to be limited. As such they are not particularly useful in the disclosed tungsten CMP compositions.

The polishing composition may include substantially any suitable concentration of the amine compound. In general the concentration is desirably high enough to provide adequate etch inhibition, but low enough so that the compound is soluble and so as not to reduce tungsten polishing rates below acceptable levels. By soluble it is meant that the compound is fully dissolved in the liquid carrier or that it forms micelles in the liquid carrier or is carried in micelles. It may be necessary to vary the concentration of the amine compound depending upon numerous various factors, for example, including the solubility of the amine compound, the number of amine groups in the amine compound, the length of an alkyl group in the amine compound, the relationship between etch rate inhibition and polishing rate inhibition, the oxidizing agent used, the concentration of the oxidizing agent, and so on. In certain desirable embodiments, the concentration of the amine compound in the polishing composition is in a range from about 0.1 μM to about 10 mM (i.e., from about $10^{-7}$ to about $10^{-2}$ molar). For example, in embodiments utilizing an amine based polymer having a high molecular weight, the concentration may be on the lower end of the range (e.g., from about $10^{-7}$ to about $10^{-4}$ molar). In other embodiments utilizing a comparatively simple amine compound (having fewer amine groups and a lower molecular weight), the concentration may be on the higher end of the range (e.g., from about $10^{-5}$ to about $10^{-2}$ molar).

The polishing composition may optionally further include a biocide. The biocide may include any suitable biocide, for example an isothiazolinone biocide. The amount of biocide in the polishing composition typically is in a range from about 1 ppm to about 50 ppm, and preferably from about 1 ppm to about 20 ppm.

The polishing composition may be prepared using any suitable techniques, many of which are known to those skilled in the art. The polishing composition may be prepared in a batch or continuous process. Generally, the polishing composition may be prepared by combining the components thereof in any order. The term "component" as used herein includes the individual ingredients (e.g., the colloidal silica, the iron containing accelerator, the amine compound, etc.)

For example, the silica may be dispersed in the aqueous liquid carrier. The silica may then be treated, for example, with an aminosilane so as to produce generate a colloidal silica having a permanent positive charge of at least 6 mV. Other components such as an iron containing accelerator, a stabilizer, and the amine compound may then be added and mixed by any method that is capable of incorporating the components into the polishing composition. The oxidizing agent may be added at any time during the preparation of the polishing composition. For example, the polishing composition may be prepared prior to use, with one or more components, such as the oxidizing agent, being added just prior to the CMP operation (e.g., within about 1 minute, or within about 10 minutes, or within about 1 hour, or within about 1 day, or within about 1 week of the CMP operation). The polishing composition also may also be prepared by mixing the components at the surface of the substrate (e.g., on the polishing pad) during the CMP operation.

The polishing composition may be supplied as a one-package system comprising a colloidal silica having a permanent positive charge of at least 6 mV, an amine compound, an optional iron containing accelerator and stabilizer, an optional biocide, and water. The oxidizing agent desirably is supplied separately from the other components of the polishing composition and is combined, e.g., by the end-user, with the other components of the polishing composition shortly before use (e.g., 1 week or less prior to use, 1 day or less prior to use, 1 hour or less prior to use, 10 minutes or less prior to use, or 1 minute or less prior to use). Various other two-container, or three- or more-container, combinations of the components of the polishing composition are within the knowledge of one of ordinary skill in the art.

The polishing composition of the invention may also be provided as a concentrate which is intended to be diluted with an appropriate amount of water prior to use. In such an embodiment, the polishing composition concentrate may include the colloidal silica having a permanent positive charge of at least 6 mV, the amine compound, the optional iron containing accelerator and stabilizer, the optional biocide, and water, with or without the oxidizing agent, in amounts such that, upon dilution of the concentrate with an appropriate amount of water, and the oxidizing agent if not already present in an appropriate amount, each component of the polishing composition will be present in the polishing composition in an amount within the appropriate range recited above for each component. For example, the colloidal silica having a permanent positive charge of at least 6 mV, the amine compound, the optional iron containing accelerator and the stabilizer, may each be present in the polishing composition in an amount that is about 2 times (e.g., about 3 times, about 4 times, about 5 times, or even about 10 times) greater than the concentration recited above for each component so that, when the concentrate is diluted with an equal volume of (e.g., 2 equal volumes of water, 3 equal volumes of water, 4 equal volumes of water, or even 9 equal volumes of water respectively), along with the oxidizing agent in a suitable amount, each component will be present in the polishing composition in an amount within the ranges set forth above for each component. Furthermore, as will be understood by those of ordinary skill in the art, the concentrate may contain an appropriate fraction of the water present in the final polishing composition in order to ensure that other components are at least partially or fully dissolved in the concentrate.

Although the polishing composition of the invention may be used to polish any substrate, the polishing composition is particularly useful in the polishing of a substrate comprising at least one metal including tungsten and at least one dielectric material. The tungsten layer may be deposited over one or more barrier layers, for example, including titanium and/or titanium nitride (TiN). The dielectric layer may be a metal oxide such as a silicon oxide layer derived from tetraethylorthosilicate (TEOS), porous metal oxide, porous or non-porous carbon doped silicon oxide, fluorinedoped silicon oxide, glass, organic polymer, fluorinated organic polymer, or any other suitable high or low-k insulating layer.

The polishing method of the invention is particularly suited for use in conjunction with a chemical mechanical polishing (CMP) apparatus. Typically, the apparatus includes a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and the polishing composition of the invention and then the polishing pad moving relative to the substrate, so as to abrade at least a portion of the substrate (such as tungsten, titanium, titanium nitride, and/or a dielectric material as described herein) to polish the substrate.

A substrate can be planarized or polished with the chemical mechanical polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

The following examples further illustrate the invention but, of course, should not be construed as in any way limiting its scope.

EXAMPLE 1

A number of polishing compositions were prepared in order to evaluate various performance metrics of the compositions. A standard composition was used as a base composition for all formulations with only the amount and type of amine compound varied. The standard composition was prepared as follows:
A dispersion was prepared including 3.0 weight percent colloidal silica and 0.01 weight percent (100 ppm) of bis-(gamma-trimethoxysilylpropyl)amine (an aminosilane). The dispersion was prepared by mixing a concentrated colloidal silica dispersion having a mean particle size of 75 nm (such as are commercially available from Akso Nobel, Fuso, and Nalco as listed above) with the aminosilane and water. The dispersion was mixed for a number of hours to adequately treat the colloidal silica with the aminosilane. The treated colloidal silica dispersion was then added to a mixture including malonic acid, ferric nitrate, and water such that the final concentrations in the composition were as follows: 2.0 weight percent treated colloidal silica, 0.0031 weight percent ferric nitrate, and 0.067 weight percent malonic acid. The pH of the mixture was then adjusted to 2.4 using nitric acid. This mixture was used as a stock solution in which various amine compounds were dissolved prior to performing zeta potential measurements, static etch tests, and CMP tests as described in more detail in the subsequent examples.

EXAMPLE 2

The tungsten etch rate and zeta potential of the colloidal silica were evaluated in this example for various polishing compositions. This example demonstrates the effect of various amine compounds as a function of the longest alkyl chain length in the amine compound. To obtain the tungsten etch rate for each polishing composition, the composition was first heated to 45 degrees C. after which hydrogen peroxide was added to a concentration of 2 percent. After waiting 5 minutes for the temperature to return to 45 degrees, a two-inch wafer having a tungsten layer was submersed in the polishing compositions for 5 minutes. Tungsten removal rates were determined via resistivity measurements made before and after immersion in the polishing compositions. The zeta potential measurements were obtained using a DT1200 electro-acoustic spectrometer available from Dispersion Technologies, Inc. The polishing compositions (Controls A and B and inventive compositions 2A through 2M) were obtained by adding an appropriate amount of the indicated amine compound to a sample of the stock solution described above in Example 1. The alkyl chain length (in number of carbon atoms), the concentration of the amine compound, the tungsten etch rate, and the zeta potential of the colloidal silica particles are indicated in Table 1. Control A included no inhibitor and control B included glycine. Inventive samples 2A through 2M included the following amine compounds: (2A) octadecylmethyl[polyoxyethylene (15)]ammonium chloride, (2B) cocoalkylmethyl[polyoxyethylene (15)]ammonium chloride, (2C) benzalkonium chloride, (2D) hexadecylamine, (2E) benzyldimethylhexadecylammonium chloride, (2F) tetradecylamine, (2G) dodecylamine, (2H) decylamine, (2I) octylamine, (2J) cocamidopropylamine oxide, (2K) benzyltributylammonium chloride, and (2L) tetrabutylammonium hydroxide.

TABLE 1

| Polishing Composition | Alkyl Chain Length (#C) | Concentration (mmol) | W Etch Rate (Ang/min) | Zeta Potential (mV) |
| --- | --- | --- | --- | --- |
| Control A | | | 132 | |
| Control B | 2 | 2.4 | 78 | 26 |
| 2A | 18 | 2.4 | 11 | 27 |
|    |    | 1.2 | 9  |    |
| 2B | 16 | 2.4 | 4 | 27 |
| 2C | 16 | 2.4 | 9 | 34 |
|    |    | 1.2 | 6 |    |
| 2D | 16 | 2.4 | 4 | 26 |
|    |    | 1.2 | 1 |    |
| 2E | 14 | 2.4 | 4 | 33 |
|    |    | 1.2 | 4 |    |
| 2F | 14 | 2.4 | 2 | 28 |
|    |    | 1.2 | 11 |    |
| 2G | 12 | 2.4 | 5 | 26 |
|    |    | 1.2 | 113 |    |
| 2H | 10 | 2.4 | 140 | 26 |
|    |    | 1.2 | 134 |    |
| 2I | 8 | 2.4 | 115 | 25 |
|    |    | 1.2 | 142 |    |
| 2J | 4 | 2.4 | 2 | 32 |
|    |    | 1.2 | 3 |    |
| 2K | 4 | 2.4 | 132 | 30 |
|    |    | 1.2 | 160 |    |
| 2L | 4 | 2.4 | 143 | 30 |
|    |    | 1.2 | 124 |    |

As is apparent from the results set forth in Table 1, compositions 2A-2G, which included amine compounds having an alkyl chain length greater than 10 (12, 14, 16, and 18) exhibited W etch rates of one-tenth or less that of control A (no inhibitor) and one-seventh or less that of control B (glycine).

EXAMPLE 3

The tungsten etch rate and zeta potential of the colloidal silica were evaluated in this example for various other polishing compositions. This example demonstrates the effect of various amine containing polymers (3A-3E). The tungsten etch rates and zeta potential measurements were obtained using the same methodologies as described in Example 2. The polishing compositions (controls A and B and inventive compositions 3A through 3E) were obtained by adding an appropriate amount of the indicated amine compound to a sample of the stock solution described above in Example 1. The alkyl chain length (in number of carbon atoms), the concentration of the amine compound, the tungsten etch rate, and the zeta potential of the colloidal silica are indicated in Table 2. Control A included no inhibitor and control B included glycine. Inventive samples 3A through 3E included the following amine compounds: (3A) Merquat 280 which is a polymer having alternating diallyl dimethyl ammonium chloride and acrylic acid groups and having a molecular weight of about 450,000, (3B) Merquat 106 which is a polymer having repeating dimethyl ammonium chloride groups and a molecular weight of about 15,000, (3C) pentaethylenehexamine, (3D) tetraethylenepentamine, and (3E) pentamethyldiethylenetriamine.

TABLE 2

| Polishing Composition | Alkyl Chain Length (#C) | Concentration (mmol) | W Etch Rate (Ang/min) | Zeta Potential (mV) |
|---|---|---|---|---|
| Control A | | | 132 | |
| Control B | 2 | 2.4 | 78 | 26 |
| 3A | 4 | 0.0012 | 20 | NA |
| | | 0.00062 | 28 | |
| 3B | 4 | 0.0012 | 54 | NA |
| | | 0.00062 | 48 | |
| 3C | 4 | 2.4 | 51 | 23 |
| | | 1.2 | 44 | |
| 3D | 2 | 2.4 | 54 | 22 |
| | | 1.2 | 38 | |
| 3E | 2 | 2.4 | 132 | 24 |
| | | 1.2 | 125 | |

As is apparent from the results set forth in Table 2, compositions 3A, 3B, 3C, and 3D exhibited W etch rates significantly less than that of the controls. The etch rate of composition 3E was similar to that of control A (no inhibitor).

EXAMPLE 4

The tungsten etch rate and zeta potential of the colloidal silica were evaluated in this example for still other polishing compositions. This example demonstrates the effect of various polycationic amine containing compounds (4A-4K). The tungsten etch rates and zeta potential measurements were obtained using the same methodologies as described in Example 2. The polishing compositions (controls A and B and inventive compositions 4A through 4K) were obtained by adding an appropriate amount of the indicated amine compound to a sample of the stock solution described above in Example 1. The alkyl chain length (in number of carbon atoms), the concentration of the amine compound, the tungsten etch rate, and the zeta potential of the colloidal silica are indicated in Table 3. Control A included no inhibitor and control B included glycine. Inventive samples 4A through 4K included the following amine compounds: (4A) N,N'-methylenebis (dimethyltetradecylammonium bromide), (4B) 1,1,4,4-tetrabutylpiperazinedium dibromide, (4C) N,N,N',N',N'-pentamethyl-N-tallow-1,3-propane-diammonium dichloride, (4D) 1,5-dimethyl-1,5-diazoniabicyclo(3.2.2)nonane dibromide, (4E) N(1),N(6)-didoecyl-N(1),N(1),N(6),N(6)-tetramethyl-1,6-hexanediaminium diiodide, (4F) decamethonium bromide, (4G) methanetetrayltetrakis (tetramethylammonium bromide), (4H) hexamethonium chloride, (4I) tetramethyl-p-phenylenediamine, (4J) didodecyl-tetramethyl-1,4-butanediaminium diiodide, and (4K) N(1),N(1),N(3)-tributyl-N(3)-{3-[dibutyl(methyl)ammonio]propyl-N(1),N(3)-dimethyl-1,3-propanediaminium triiodide.

TABLE 3

| Polishing Composition | Alkyl Chain Length (#C) | Concentration (mmol) | W Etch Rate (Ang/min) | Zeta Potential (mV) |
|---|---|---|---|---|
| Control A | | | 132 | |
| Control B | 2 | 2.4 | 78 | 26 |
| 4A | 10 | 0.6 | 4 | 28 |
| | | 0.3 | 14 | |
| 4B | 4 | 0.6 | 78 | 27 |
| | | 0.3 | 48 | |
| 4C | 18 | 0.2 | 11 | 25 |
| | | 0.1 | 57 | |
| 4D | 3 | 0.6 | 19 | 27 |
| | | 0.3 | 6 | |
| 4E | 12 | 0.6 | −2 | 27 |
| | | 0.3 | 121 | |
| 4F | 3 | 0.6 | 116 | 29 |
| | | 0.3 | 113 | |
| 4G | 5 | 0.6 | 110 | 29 |
| | | 0.3 | 121 | |
| 4H | 6 | 2.4 | 185 | 30 |
| | | 1.2 | 176 | |
| 4I | 1 | 2.4 | 102 | 25 |
| | | 1.2 | 117 | |
| 4J | 12 | 0.6 | 0 | 29 |
| | | 0.3 | 0 | |
| 4K | 4 | 0.6 | 19 | 29 |
| | | 0.3 | 121 | |

As is apparent from the results set forth in Table 3, compositions 4A, 4C, 4D, 4E, 4J, and 4K may exhibit W etch rates significant less than that of the controls (depending on the concentration of the inhibitor).

EXAMPLE 5

The tungsten etch rate and zeta potential of the colloidal silica were evaluated in this example for various other polishing compositions. This example demonstrates the effect of various heterocyclic polyamine compounds. The tungsten etch rates and zeta potential measurements were obtained using the same methodologies as described in Example 2. The polishing compositions (controls A and B and compositions 5A through 5F) were obtained by adding an appropriate amount of the indicated amine compound to a sample of the stock solution described above in Example 1. The alkyl chain length (in number of carbon atoms), the concentration of the amine compound, the tungsten etch rate, and the zeta potential of the colloidal silica are indicated in Table 4. Control A included no inhibitor and control B included glycine. Samples 5A through 5F included the following amine compounds: (5A) 2-(aminomethy)pyridine, (5B) 2,2'dipyridylamine, (5C) benzotriazole, (5D) 2-aminopyrimidie, (5E) 4-aminopyridine, and (5F) 5-aminotetrazole.

TABLE 4

| Polishing Composition | Alkyl Chain Length (#C) | Concentration (mmol) | W Etch Rate (Ang/min) | Zeta Potential (mV) |
|---|---|---|---|---|
| Control A | | | 132 | |
| Control B | 2 | 2.4 | 78 | 26 |
| 5A | 1 | 2.4 | 121 | 23 |
| | | 1.2 | 128 | |
| 5B | 0 | 2.4 | 99 | 24 |
| | | 1.2 | 125 | |
| 5C | 0 | 2.4 | 174 | 28 |
| | | 1.2 | 223 | |
| 5D | 0 | 2.4 | 190 | 28 |
| | | 1.2 | 115 | |
| 5E | 0 | 2.4 | 193 | 25 |
| | | 1.2 | 203 | |
| 5F | 0 | 2.4 | 177 | 28 |
| | | 1.2 | 202 | |

As is apparent from the results set forth in Table 4, none of compositions 5A through 5F exhibited a W etch rate of less than that of the glycine control. All but composition 5B exhibited W etch rates about equal to or greater than the control including no inhibitor.

EXAMPLE 6

Zeta potential measurements and conductivity measurements were obtained for treated silica samples before and after filtration. A 200 ml volume of each composition was filtered through a Millipore Ultracell regenerated cellulose ultrafiltration disk (having a MW cutoff of 100,000 Daltons and a pore size of 6.3 nm). The remaining dispersion (the dispersion that was retained by the ultrafiltration disk) was collected and replenished to the original 200 ml volume using deionized water adjusted to pH 2.6 with nitric acid. This procedure was repeated for a total of three ultrafiltration cycles (each of which includes an ultrafiltration step and a replenishing step). The zeta-potential and electrical conductivity of the polishing composition were measured before and after the ultrafiltration procedure (i.e., on the original polishing composition and the triply ultra-filtered and replenished polishing composition). Table 5 shows the measured zeta potential and conductivity for polishing compositions 6A and 6B. Polishing composition 6A contained a 55 nm colloidal silica treated with 3-(aminopropyl)trimethoxylsilane while polishing composition 6B contained a 55 nm colloidal silica treated with tetrabutylammonium hydroxide. As described above, the zeta potential and electrical conductivity of the original compositions were measured before and after above described ultrafiltration procedure. Corrected zeta-potential values of the triply ultra-filtered and replenished polishing composition (corrected for ionic strength differences as indicated by the conductivity change) are also shown.

TABLE 5

| Polishing Composition | Zeta Potential Before (mV) | Conductivity Before (µs/cm) | Zeta Potential After (mV) | Conductivity After (µs/cm) | Zeta Potential Corrected (mV) |
|---|---|---|---|---|---|
| 6A | 41 | 2130 | 56 | 1156 | 41 |
| 6B | 10 | 1030 | 3 | 1083 | 3 |

As is apparent from the results set forth in Table 5, the zeta potential of sample 6A is not changed by filtration indicating that the colloidal silica has a permanent positive charge of 41 mV. The zeta potential of sample 6B decreased from 10 to 3 mV indicating that the positive charge colloidal silica was not permanent.

EXAMPLE 7

Both the tungsten etch rate and the tungsten polishing rate were evaluated in this example for various polishing compositions. This example demonstrates the effect of various amine compounds on the tungsten etch rates and tungsten polishing rates for the corresponding polishing compositions. The CMP compositions were obtained using the procedure described in Example 1. The compositions were similar to those described above with the exception that they included the following final concentrations: 1.5 weight percent treated colloidal silica, 0.0012 weight percent ferric nitrate, 0.0267 weight percent malonic acid, and 0.5 percent hydrogen peroxide.

The tungsten etch rates were obtained using the same methodology described in Example 2. The tungsten polishing rates were obtained using a Mirra® CMP Tool (available from Applied Materials). Eight inch wafers having a tungsten layer deposited on a surface thereof were polished on an IC1010 polishing pad at a down-force of 1.5 psi, a platen speed of 100 rpm, and a slurry flow rate of 150 ml/min. The polishing compositions (the control and compositions 6A through 6I) were obtained by adding an appropriate amount of the indicated amine compound to a sample of the stock solution described above in Example 1. The alkyl chain length (in number of carbon atoms), the concentration of the amine compound (in ppm by weight), the tungsten etch rate, and the tungsten polishing rate are indicated in Table 6. The control included glycine. Samples 6A through 6I included the following amine compounds (6A) N,N,N'',N''-Tetrabutyl-1,6-hexanediamine, (6B) cetyltrimethylammonium bromide, (6C) Di(hydrogenated Tallowalky) quaternary amine, (6D) N,N,N',N',N'-pentamethyl-N-tallow-1,3-propane-diammonium dichloride, (6E) poly[(3-(methacryloylamino)-propyl]trimethylammonium chloride, acrylamine and acrylic acid, (6F) an ampholytic terpolymer of methacrylmidopropyl trimethyl ammonium chloride, acrylamide and acrylic acid, (6G) polyethyleimine, (6H) Pentamethyldiethylenetriamine, and (6I) 1-[Bis[3-(dimethylamino)proyl]amino]-propanol.

TABLE 6

| Polishing Composition | Alkyl Chain Length (#C) | Concentration (ppm) | W Etch Rate (Ang/min) | W Polish Rate (Ang/min) |
|---|---|---|---|---|
| Control | 2 | 1600 | 66 | 215 |
| 6A | 6 | 1000 | 63 | 202 |
| 6B | 16 | 100 | 3 | 141 |
| | | 50 | 2 | 171 |
| 6C | 18 | 100 | 72 | 79 |
| | | 300 | 2 | 73 |
| 6D | 18 | 100 | 14 | 138 |
| 6E | 3 | 100 | 110 | 212 |
| 6F | 6 | 100 | 120 | 202 |
| 6G | 2 | 20 | 5 | 42 |
| 6H | 2 | 300 | 132 | 214 |
| 6I | 3 | 300 | | 183 |

As is apparent from the results set forth in Table 6, compositions 6B and 6D exhibit etch rates significantly less than the control and W polishing rate only marginally less than the control. Compositions 6C (high concentration) and 6G exhibit both etch rates and W polishing rates that are significantly less than the control.

It will be understood that the recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A method of chemical mechanical polishing a substrate including a tungsten layer, the method comprising:
    (a) contacting the substrate with a polishing composition comprising:
        (i) a water based liquid carrier;
        (ii) a colloidal silica abrasive dispersed in the liquid carrier, the colloidal silica abrasive having a permanent positive charge of at least 6 mV;
        (iii) an amine compound in solution in the liquid carrier, wherein the amine compound comprises an alkyl group having 12 or more carbon atoms; and
        (iv) an iron containing accelerator
    (b) moving the polishing composition relative to the substrate; and
    (c) abrading the substrate to remove a portion of the tungsten from the substrate and thereby polish the substrate.

2. The method of claim 1, wherein the colloidal silica has a permanent positive charge of at least 15 mV.

3. The method of claim 1, wherein the colloidal silica is treated with an aminosilane compound selected from the group consisting of bis(2-hydroxyethyl)-3-aminopropyl trialkoxysilane, diethylaminomethyltrialkoxysilane, (N,N-diethyl-3-aminopropyl)trialkoxysilane), 3-(N-styrylmethyl-2-aminoethylaminopropyl trialkoxysilane, aminopropyl trialkoxysilane, (2-N-benzylaminoethyl)-3-aminopropyl trialkoxysilane), trialkoxysilyl propyl-N,N,N-trimethyl ammonium chloride, N-(trialkoxysilylethyl)benzyl-N,N,N-trimethyl ammonium chloride, (bis(methyldialkoxysilylpropyl)-N-methyl amine, bis(trialkoxysilylpropyl)urea, bis(3-(trialkoxysilyl)propyl)-ethylenediamine, bis (trialkoxysilylpropyl)amine, bis(trialkoxysilylpropyl)amine, and mixtures thereof.

4. The method of claim 1, wherein the iron containing accelerator comprises a soluble iron containing catalyst and the polishing composition further comprises a stabilizer bound to the soluble iron containing catalyst, the stabilizer being selected from the group consisting of phosphoric acid, phthalic acid, citric acid, adipic acid, oxalic acid, malonic acid, aspartic acid, succinic acid, glutaric acid, pimelic acid, suberic acid, azelaic acid, sebacic acid, maleic acid, glutaconic acid, muconic acid, ethylenediaminetetraacetic acid, propylenediaminetetraacetic acid, and mixtures thereof.

5. The method of claim 1, wherein the amine compound is selected from the group consisting of dodecylamine, tetradecylamine, hexadecylamine, oxtadecylamine, oleylamine, N-methyldioctylamine, N-methyloctadecylamine, cocamidopropylamine oxide, benzyldimethylhexadecylammonium chloride, benzalkonium chloride, and cocoalkylmethyl[polyoxyethylene (15)] ammonium chloride, and octadecylmethyl[polyoxyethylene (15)] ammonium chloride, N,N'-methylenebis (dimethyltetradecylammonium bromide), N,N,N',N',N'-pentamethyl-N-tallow-1,3-propane-diammonium dichloride, didodecyl-tetramethyl-1,4-butanediaminium diiodide, and N(1),N(6)-didodecyl-N(1),N(1),N(6),N(6)-tetramethyl-1,6-hexanediaminium diiodide, and mixtures thereof.

6. A method of chemical mechanical polishing a substrate including a tungsten layer, the method comprising:
    (a) contacting the substrate with a polishing composition comprising:
        (i) a water based liquid carrier;
        (ii) a colloidal silica abrasive dispersed in the liquid carrier, the colloidal silica abrasive having a permanent positive charge of at least 6 mV;
        (iii) an amine compound in solution in the liquid carrier, wherein the amine compound is a diquaternary amine compound; and
        (iv) an iron containing accelerator
    (b) moving the polishing composition relative to the substrate; and
    (c) abrading the substrate to remove a portion of the tungsten from the substrate and thereby polish the substrate.

7. The method of claim 6, wherein the diquaternary amine compound is selected from the group consisting of N,N'-methylenebis(dimethyltetradecylammonium bromide), 1,1,4,4-tetrabutylpiperazinediium dibromide, N,N,N',N',N'-pentamethyl -N-tallow-1,3-propane-diammonium dichloride, N,N'-hexamethylenebis(tributylammonium hydroxide), didodecyl-tetramethyl-1,4-butanediaminium diiodide, 1,5-dimethyl-1,5-diazoniabicyclo(3.2.2)nonane dibromide, and N(1),N(6)-didodecyl-N(1),N(1),N(6),N(6)-tetramethyl-1,6-hexanediaminium diiodide, and mixtures thereof.

8. The method of claim 6, wherein the diquaternary amine compound comprises an alkyl group having 10 or more carbon atoms.

* * * * *